(12) United States Patent
Mizukawa et al.

(10) Patent No.: US 7,656,079 B2
(45) Date of Patent: Feb. 2, 2010

(54) HEATER AND HEATING DEVICE WITH HEATERS WITH LAMPS HAVING AN INDEPENDENTLY POWERED MULTIPLE PART FILAMENT

(75) Inventors: Yoichi Mizukawa, Himeji (JP); Keita Kanazu, Himeji (JP); Masaki Yoshioka, Himeji (JP); Shinji Suzuki, Himeji (JP); Kyohei Seki, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 603 days.

(21) Appl. No.: 11/362,788

(22) Filed: Feb. 28, 2006

(65) Prior Publication Data
US 2006/0197454 A1 Sep. 7, 2006

(30) Foreign Application Priority Data
Mar. 2, 2005 (JP) ............................. 2005-057803
Jun. 30, 2005 (JP) ............................. 2005-191222

(51) Int. Cl.
H01K 9/00 (2006.01)
(52) U.S. Cl. ....................................... 313/316; 313/315
(58) Field of Classification Search ....................... None
See application file for complete search history.

(56) References Cited

U.S. PATENT DOCUMENTS 3,443,144 A * 5/1969 Freese, Jr. .................... 313/315
6,614,008 B2 9/2003 Tidrick
2003/0111457 A1 * 6/2003 Tidrick ....................... 219/483
2004/0112885 A1 6/2004 Shigeoka et al.
2004/0182847 A1 9/2004 Ohkubo et al.

FOREIGN PATENT DOCUMENTS

| DE | 10024709 A1 | 11/2001 |
| GB | 465066 A | 4/1937 |
| JP | 7-37833 A | 2/1995 |
| JP | 7-16353 U | 3/1995 |
| JP | 2001-210604 A | 8/2001 |

* cited by examiner

Primary Examiner—Toan Ton
Assistant Examiner—Britt D Hanley
(74) Attorney, Agent, or Firm—David S. Safran; Roberts Mlotkowski Safran & Cole, P.C.

(57) ABSTRACT

A heating device in which uniform heating of an article to be processed is possible even in the case a temperature change which leads to a loss of the uniformity of the temperature distribution in a narrowly delineated area, and in which a reduction in the size of the device is possible. The heating device has a plurality of heaters, each heater having a single bulb of transparent material in which there is a filament that is divided in the axial direction into several filament parts and the respective filament parts are supplied with power independently of each other.

3 Claims, 9 Drawing Sheets

FIG. 11 (PRIOR ART)
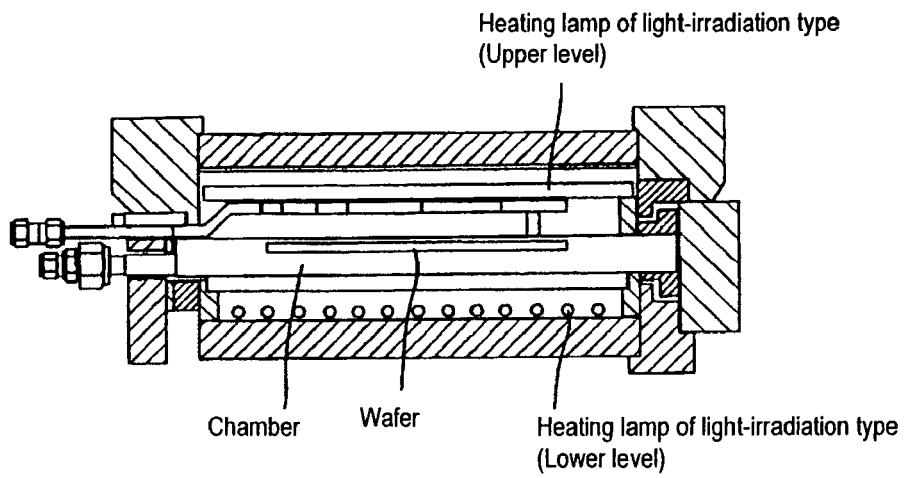
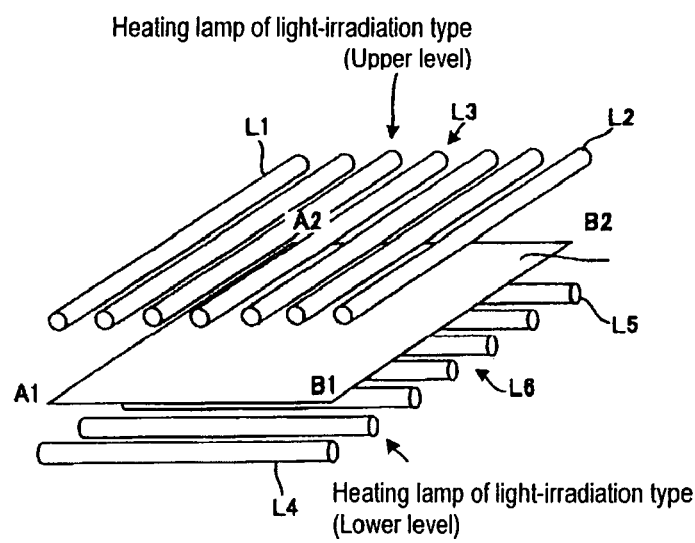
FIG. 12 (PRIOR ART)

HEATER AND HEATING DEVICE WITH HEATERS WITH LAMPS HAVING AN INDEPENDENTLY POWERED MULTIPLE PART FILAMENT

BACKGROUND OF THE INVENTION

1. Field of the Invention

The invention relates to a heater and a heating device with heaters. The invention relates especially to a heater and a heating device with heaters for irradiating an article to be processed with light which is emitted for purposes of heating of the object to be processed.

2. Description of Related Art

In general, thermal processing is used in the production of semiconductors in different processes, such as layer formation, oxidation diffusion, diffusion of impurities, nitriding, layer stabilization, silicide generation, crystallization, ion implantation-activation and the like. To improve the yield and the quality in the production of semiconductors, rapid thermal processing (RTP) is desired, in which the temperature of an article to be processed, such as a semiconductor wafer or the like, is rapidly raised or lowered. In RTP, a thermal processing device of the light irradiation type using light irradiation from a light source, such as a filament lamp or the like, is popularly used.

In a filament lamp in which there is a filament within a bulb of transparent material, at least 90% of the input power is completely radiated, and heating of the article to be heated without contact is possible. Therefore, the filament lamp is a lamp in which light can be used as heat. In the case of using such a filament lamp as a heat source for heating a glass substrate or a semiconductor wafer, the temperature of the article to be heated can be raised or lowered more quickly than in a resistance heating process.

This means that thermal processing of the light irradiation type can, for example, raise the temperature of the article to be processed to at least 1000° C. within ten to a few dozen seconds. The article to be processed is rapidly cooled after light irradiation is stopped. This thermal processing of the light irradiation type is normally carried out several times.

When the article to be processed is, for example, a semiconductor wafer, and if no uniformity of the temperature distribution is caused in the semiconductor wafer during heating, there is the possibility that a defect of crystal transition occurs, that is, a phenomenon called slip in the semiconductor wafer, and inferior goods will be formed. Therefore, in the case of carrying out RTP of a semiconductor wafer using a thermal processing device of the light irradiation type, it is necessary to carry out heating to obtain a high temperature, maintaining the high temperature and cooling such that the temperature distribution on the entire surface of the semiconductor wafer is made uniform. That is, in RTP, highly precise uniformity of the temperature of the article to be processed is required.

Japanese patent publication JP-A-HEI 7-37833 discloses, as a conventional heating device, one in which light which is emitted from a filament lamp is used to heat a glass substrate or a semiconductor wafer. As is shown in FIG. 11, this heating device is arranged such that an article to be processed is mounted within a chamber which has been formed from a transparent material, on the top and the bottom, therefore on both sides, outside this chamber there are several filament lamps arranged opposite each other at the top and bottom, and moreover, crossing one another, and that these filament lamps irradiate the article to be processed from the two sides with light and thus heat it.

FIG. 12 is a perspective in which the above described device is shown simplified and the heating filament lamps which are located on the top and bottom, i.e., on the two sides, and the article to be processed are not shown. As is shown in the drawing, the heating filament lamps which are located on the top and bottom, i.e., on the two sides, are arranged such that the tube axes cross. Therefore, the article to be processed can be uniformly heated. Moreover, with this device a temperature decrease because of the heat radiation action in the edge area of the article to be processed can be further prevented. By the measure that, with respect to the article to be processed, the lamp output of the heating filament lamps L1, L2 on the two ends of the top side is made larger than the lamp output of the heating lamps L3 in the middle area, the temperature of the edge areas A1-A2, B1-B2 of the area to be processed can be increased. Furthermore, the temperature of the edge areas A1-B1, A2-B2 of the area to be processed can be increased by the measure that, with respect to the article to be processed, the lamp output of the heating filament lamps L4, L5 on the two ends of the bottom side is made larger than the lamp output of a heating lamps L6 in the middle area.

However, it was found that the disadvantage described below arises in the above described conventional heating device. Specifically, when the article to be processed is, for example, a semiconductor wafer, a metal oxide film is formed on the surface of the semiconductor wafer by a sputtering process or the like, and impurities are doped in the semiconductor wafer by ion implantation. There are cases in which a temperature distribution occurs in the semiconductor wafer by the influence of the following factors that are deviations in the film thickness of such a metal oxide and deviations in the implantation conditions of the impurity ions. Such a temperature distribution is not limited to the linear edge areas A1-A2, B1-B2, A1-B1, A2-B2 and the like as shown in FIG. 12, but can occur in a narrow area such as, for example, only in the peripheral region of the A1 area.

Using the above described conventional heating device, the temperature drop in the linear areas, like in the edge areas A1-A2, B1-B2, A1-B1, A2-B2 or the like of the article to be processed can be prevented. However, in the case in which, in the linear edge area A1-A2 as shown in FIG. 12, the vicinity of the A1 area and the vicinity of the B1 area exhibit different temperature reduction tendencies, the two cannot be adjusted to one suitable temperature. This means that the temperature cannot be controlled in a narrow area, resulting in the following disadvantages:

a temperature distribution occurs in the processing temperature of the article to be processed and the functions which are desired for t he article to be processed are adversely affected by it.

Here, for example, in Japanese patent application publication JP-A-2002-203804 and corresponding U.S. patent application publication US 2004/0112885 A1, a thermal processing device is disclosed as is shown in FIG. 13. This device in a lamp housing comprises a first lamp unit for which there are several U-shaped, double-ended lamps arranged in the parallel and perpendicular directions with respect to the page of the drawings, in which there are feed devices for the filaments on the two ends of a bulb; and a second lamp unit which is located underneath this first lamp unit and in which several straight, double-ended lamps are arranged along the page of the drawings in a direction which is perpendicular to the page of the drawings, in which feed devices for the filaments are located on the two ends of a bulb. This thermal processing device is used for thermal processing of an article to be processed, such as a semiconductor wafer or the like, which is located underneath the second lamp unit.

It is disclosed that, in such a thermal processing device, in the article to be processed, there is a device for adjusting the U-shaped lamps of the first lamp unit which are located above a terminal part to a high output in order to increase the temperature of the terminal part on a support ring which has the tendency to a temperature which is lower than the other areas and on which the article to be processed is placed.

Japanese patent application publication JP-A-2002-203804 and corresponding U.S. patent application publication US 2004/0112885 A1 show that such a thermal processing device is used essentially as follows:

First, the heating area of the semiconductor wafer, which is the article to be processed, is divided into several concentric, center-symmetrical zones. By a combination of the distributions of the illuminance of the lamps of the first and second lamp units, patterns of the combined distributions of the illuminance are formed which correspond to the respective zone and which are center-symmetrical to the middle of the semiconductor wafer. Thus, heating is carried out according to the temperature change of the respective zone. Here, to suppress the effect of variations of the illuminance of the light from the lamps, the semiconductor wafer, which is the article to be processed, is turned. This means that heating of the respective zone which is arranged concentrically with an individual illuminance is possible.

Therefore, the technology described in Japanese patent application publication JP-A-2002-203804 and corresponding U.S. patent application publication US 2004/0112885 A1 enables the temperature to be controlled in a narrow region of the article to be processed. It can be imagined that the above described disadvantage can thus be advantageously eliminated; but, the following disadvantages occur in such a thermal processing device in practice.

The U-shaped lamps each consist of a horizontal part and a pair of vertical parts. However, only the horizontal part in which the filament is located contributes to emission. Between the filament located within the respective lamp and the filament located within the lamp which is adjacent to the horizontal part of the lamp on the same axis, there are two silica glass walls which form the respective vertical part. Furthermore, on the boundary between the horizontal part and the vertical part, a curved surface is formed, by which the horizontal part and the vertical part are formed integrally with one another. Therefore, between the adjacent filaments there is a space with a rather large overall length which does not contribute to emission. As a result, it can be imagined that the disadvantage arises that a nonuniformity of temperature occurs in the area directly underneath this space.

This means that the illuminance changes (decreases) relatively drastically in the area directly underneath the above described space even by a combination of the distributions of the illuminance of the lamps of the first and second lamp units which correspond to the respective zone, and even by the combined distribution of the illuminance on the semiconductor wafer which is center-symmetrical. Therefore, it can be imagined that it is relatively difficult to reduce the temperature nonuniformity in the vicinity of the area directly underneath the above described space even if heating which corresponds to the temperature change of the respective zone is to be carried out.

Also, since, in such a thermal processing device, there has recently been the tendency to make the space (mainly in the vertical direction) for the arrangement of the lamp units extremely small, when using U-shaped lamps, a space is required which corresponds to the vertical part of the lamp. This thermal processing device is therefore not advantageous with respect to the saving of space in the vertical direction.

SUMMARY OF THE INVENTION

The invention was devised to eliminate the above described disadvantages in the prior art. Thus, a primary object of the invention is to devise a heating device in which uniform heating of a substrate is possible even in the case of a distribution of the degree of local temperature change on the substrate which is to be thermally processed is asymmetrical with respect to the shape of the substrate, in which uniform heating of the article to be processed is also possible in the case of formation of a temperature change which leads to a loss of the uniformity of the temperature distribution in a narrowly delineated area, and in which a reduction in the size of the device is possible.

In a heater in which there is a filament within a single bulb of transparent material, the object is achieved in accordance with the invention in that the filament is divided in the axial direction into several parts and that each of the filament parts which have been formed by division is supplied with energy independently of the others.

The object is also achieved as in accordance with the invention in that there is an insulator between the filament parts.

Additionally, the object is achieved in accordance with the invention in that the lead wires which are electrically connected to a respective end of each filament part are routed to different ends of the bulb.

The object is achieved, moreover, in accordance with the invention, by the lead wires which are electrically connected to a respective end of each filament part are routed to the same end of the bulb.

Furthermore, the object is achieved in the invention in that a part of the lead wire which is opposite the filament is covered by an insulating tube.

Still further, the object is achieved in accordance with the invention in that the cross section of the bulb has an elliptical form.

The object is also achieved in accordance with the invention in that there are several heaters arranged parallel to one another in a heating device.

In a heating device which has a lamp unit of the above described heaters, in which the article to be processed is irradiated with light which is emitted from this lamp unit, and in which the article to be processed is thus heated, the object is furthermore achieved in accordance with the invention in that there are several of the above described heaters arranged in parallel to one another in the lamp unit.

In this case, an arrangement can also be undertaken in which at least two of the n×m filament parts which the above described lamp unit has are supplied by a common feed means where n is the number of heaters comprising the above described lamp unit and m is the number of divided filament parts of the respective heater.

Furthermore, in a heating device which comprises the following;

a first lamp unit in which there are several of the above described heaters arranged parallel to one another, and a second lamp unit in which there are several of the above described heaters arranged parallel to one another, in which the article to be processed is irradiated with light which is emitted from these first and second lamp units, and in which the article to be processed is thus heated, the object is achieved in accordance with the invention in that the first lamp unit and the second lamp unit are located opposite each other and the axial direction of each heater of the first lamp unit and the axial direction of each heater of the second lamp unit cross one another.

In this case, the article to be processed can also be located in the space between the first lamp unit and the second lamp unit.

An arrangement is also possible in which at least two of n1×m1+n2×m2 filament parts which the above described first and second lamp unit have are supplied by a common feed means where n1 is the number of heaters comprising the above described first lamp unit, m1 is the number of divided filament parts of the above described heaters, n2 is the number of heaters comprising the above described second lamp unit, and m2 is the number of divided filament parts of the above described heaters.

The object is furthermore achieved in accordance with the invention in a heating device in that the total length of the filaments in the respective heater is changed such that it is adapted to the article to be processed.

ACTION OF THE INVENTION

By means of the heater of the invention, there is an arrangement in which, within a bulb of transparent material, there is a filament which is divided in the axial direction into several parts, and in which each of the filament parts is supplied with power independently of another. Even if during thermal processing of an article to be processed using a heating device of the light radiation type with heaters in accordance with the invention, the temperature distribution becomes nonuniform in a narrowly bounded area of the article to be processed, control of the power supply of the filaments of the heaters located in this area is therefore possible. In this way, the temperature can be controlled in a narrowly bounded area on the article to be heated, in contrast to the case of using a heating device of the light irradiation type with heaters with filaments which have the conventional arrangement. Therefore, a uniform temperature distribution can be implemented over the entire article to be processed. Furthermore, a temperature increase only at the required location is possible, by which the necessary electrical energy can be minimized. The invention is therefore also outstanding with respect to environmental protection.

The distance between the individual filaments can be made extremely small without a space with a rather large total length which does not contribute to emission being present between the individual filaments due to the presence of two silica glass walls or for similar reasons, as is the case in the conventional device, by a heating device with a lamp unit composed of an array of a plurality of heaters, in which within a single bulb there are several heater filaments formed by division arranged along the axis of the bulb in the axial direction of the bulb. Therefore, the temperature distribution of the article to be processed can be made more uniform than in a conventional device. Moreover, the size of the heating device can be reduced by the space (mainly in the vertical direction) which is necessary for the arrangement of the heaters being made smaller.

Furthermore, the above described heating device with a lamp unit enables adjustment of the distribution of the illuminance on the article to be processed which has been moved away from the lamp unit by a given distance in a precise manner, and moreover, in any distribution. Adjustment of the distribution of illuminance on the article to be processed which is asymmetrical to the shape of the article to be processed is therefore enabled. In the case in which the distribution of the degree of local temperature variation on the substrate which constitutes the article to be processed and which is being thermally processed is asymmetrical to the shape of the substrate, a corresponding adjustment of the distribution of the illuminance on the article to be processed is enabled, by which uniform heating of the article to be processed is possible.

The invention is further described below using several embodiments which are shown in the accompanying drawings.

BRIEF DESCRIPTION OF THE DRAWINGS

FIG. 11 shows a cross section of a conventional heating device in a front view;

FIG. 12 schematically shows the arrangement of the lamps of the first and second lamp units as shown in FIG. 11.

DETAILED DESCRIPTION OF THE INVENTION

Figure 1:
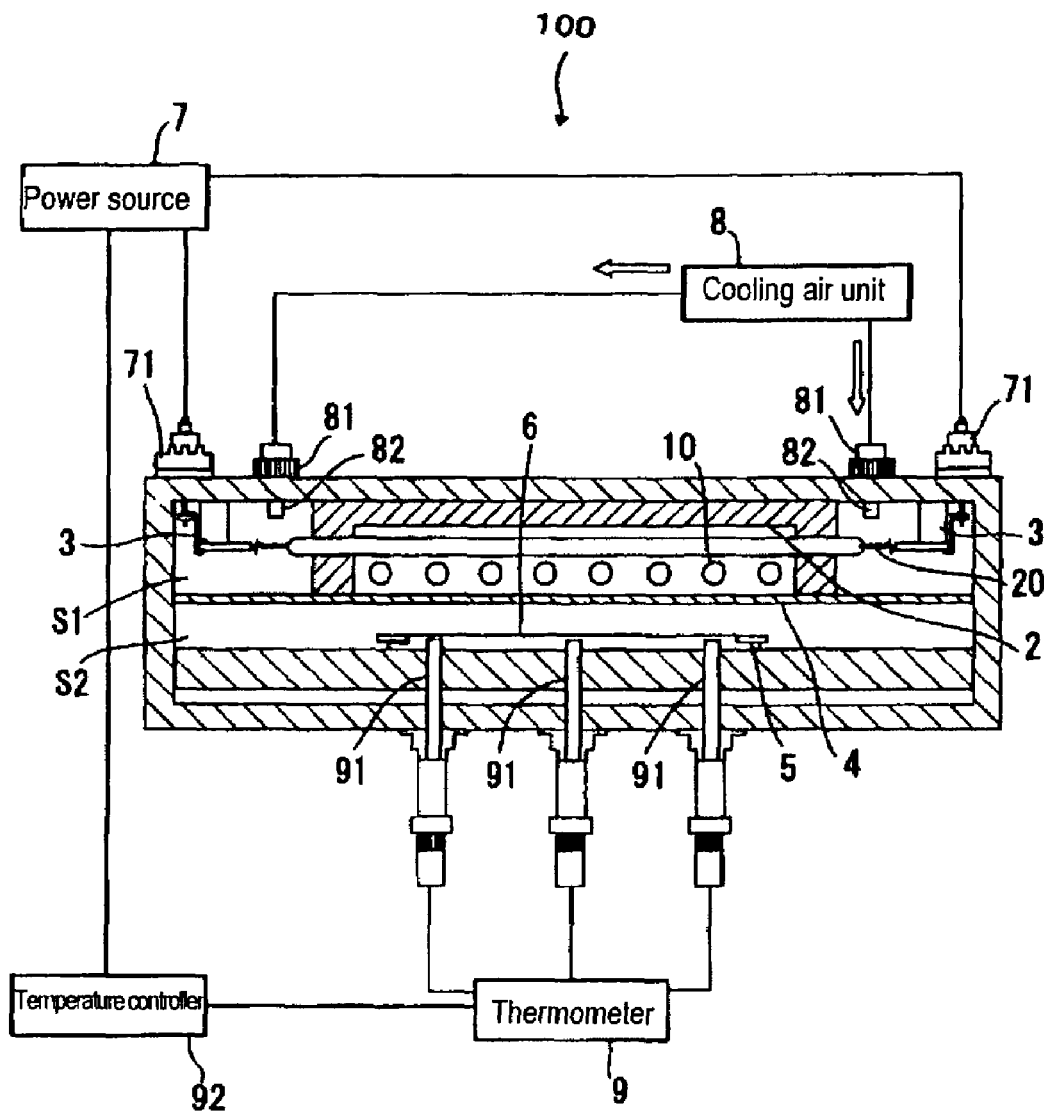
FIG. 1 is a cross section of a heating device in accordance with the invention in a front view.

The arrangement of one example of a heating device in accordance with the invention is described below with reference to FIGS. 1 & 2. As is shown in FIG. 1, the heating device 100 comprises a first lamp unit 10, a second lamp unit 20, a reflection plate 2, a first lamp mounting frame (not shown), a second lamp mounting frame 3, and a silica glass window 4. The heating device 100 irradiates light radiated from the first lamp unit 10 and the second lamp unit 20 directly onto an article 6 to be processed which is mounted in the mounting frame 5. Or the heating device 100 reflects light radiated from the first lamp unit 10 and the second lamp unit 20 using the reflection plate 2 and irradiates the reflected light onto the article 6 to be processed mounted in the mounting frame 5. The article 6 to be processed is heated by the light.

The reflection plate 2 is, for example, composed of a base material of oxygen-free copper which is coated with gold, located above the second lamp unit 20 and reflecting the light which has been radiated up from the first lamp unit 10 and the second lamp unit 20 onto the side of the article 6 to be processed. There are many cases in which the cross section of the reflection plate 2 represents a part of a circle, a part of an oval, a part of a parabola, or is flat. This reflection plate 2 is air-cooled by a cooling air supply nozzle 81 which is described below. The reflection plate 2 can also be water-cooled.

Figure 2:
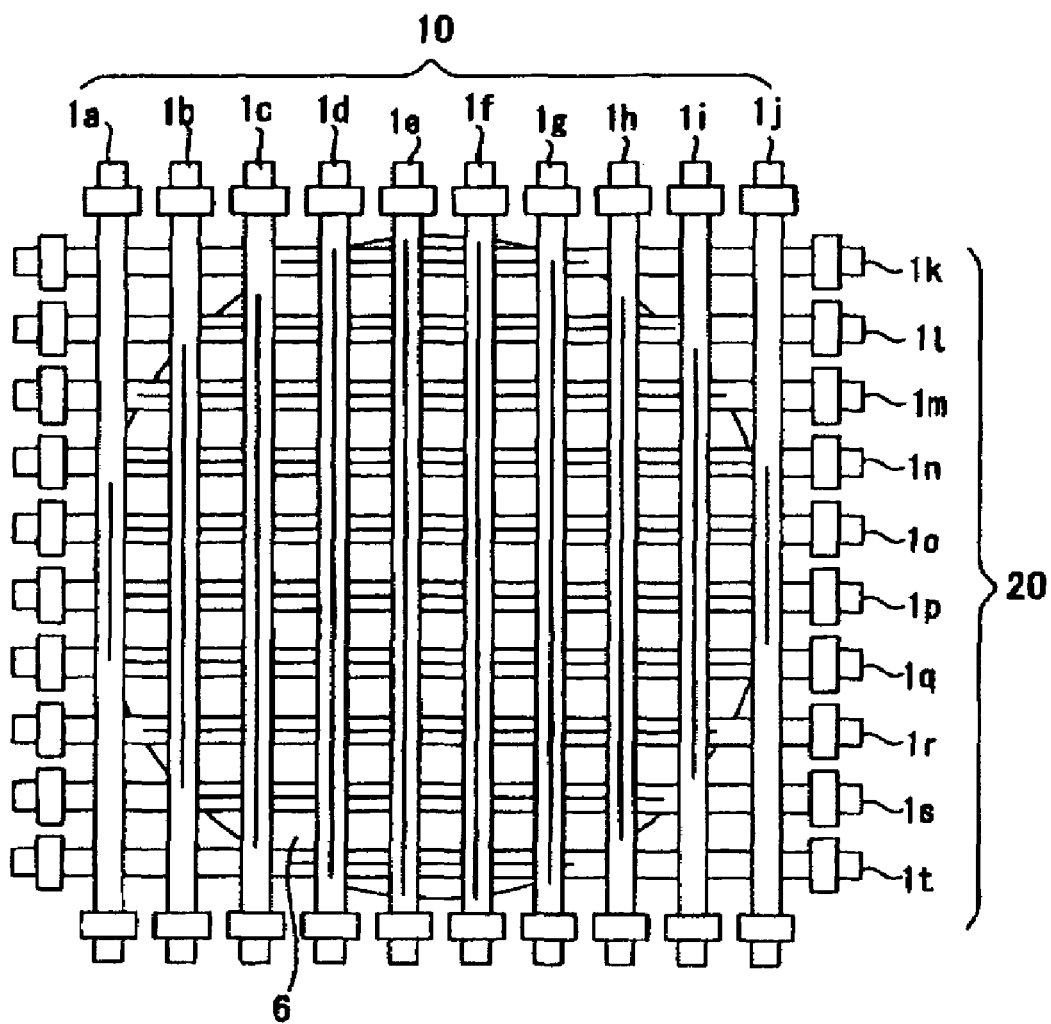
FIG. 2 shows a top view of the matrices of the first and second lamp units as shown in FIG. 1.

The first lamp mounting frame supports the respective heaters 1 (heaters 1a, 1b, 1c, 1d, 1e, 1f, 1g, 1h, 1i, 1j) of the first lamp unit 10 as shown in FIG. 2. The second lamp mounting frame 3 supports the respective heaters 1 (heaters 1k, 1l, 1m, 1n, 1o, 1p, 1q, 1r, 1s, 1t) of the second lamp unit 20 as shown in FIG. 2. It is advantageous for the mounting frame 5 to be made of quartz, silicon (Si), silicon carbide (SiC) or the like.

Furthermore, the heating device 100 comprises a power source supply port 71 which is connected to a power source part 7, a cooling air feed nozzle 81 which is connected to the cooling air unit 8, and a temperature measurement part 91 which is connected to a thermometer 9 which has a temperature control element 92 which is connected to the power source part 7.

To prevent cooling of the article 6 to be processed by the cooling air which has been supplied from the cooling air unit 8 and has been introduced from the cooling air feed nozzle 81, the inside of the heating device 100 is divided by a silica glass window 4 into a space S1 in which the lamp units are located, and into a processing space S2. Cooling air from the cooling air supply nozzle 81 is delivered into this space S1 in which the lamp units are located. By blowing cooling air into the respective heater 1 for the lamp unit 10 and lamp unit 20, the bulb of the respective heater 1 (for example, the bulb 11 described below) is cooled. The blow-out opening 82 of the cooling-air nozzle 81 is located opposite the hermetically sealed portion of the respective heater 1 described below and preferably cools the hermetically sealed portion thereof. The reason for this is that the thermal resistance of the hermetically sealed portions of the heaters is less than at other points.

A pair of power source supply ports 71 are electrically connected to the first lamp mounting frame for mounting of the first lamp unit 10 and the second lamp mounting frame 3 for mounting of the second lamp unit 20. The first lamp mounting frame is electrically connected to the feed device (for example, the outer leads 18a to 18f and the like described below) of the respective heaters for the first lamp unit 10. Furthermore, the second lamp frame 3 is electrically connected to the feed device (for example, the outer leads 18a to 18f and the like described below) of the respective heaters for the second lamp unit 20. By this arrangement, the respective heater 1 for the first lamp unit 10 and the second lamp unit 20 is supplied with power by the power source part 7. FIG. 1 shows a pair of power source supply ports 71. However, the number of power source supply ports is determined according to the number of heaters, the number of divisions of the filaments in the heaters described below, and the type and manner of division of several heaters with respect to the electrical circuit.

The temperature measurement parts 91 comprise thermocouples and optical fibers, the number of which corresponds to the dimensions of the article 6 to be processed. They are located bordering the article 6 to be processed or adjacent to it. The thermometer 9 sends electrical signals to the temperature control element 92 that provide information which corresponds to the heat energy from the article 6 to be processed and which are sent from the temperature measurement parts 91. The temperature control element 92 controls the amount of power supplied to the respective heater 1 by the power source part 7 such that the setpoint temperature is adjusted according to the type of article to be processed, and the temperature of the article 6 to be processed is brought into agreement with this setpoint temperature.

For several heaters comprising the heat source of the heating device, as was described above, for example, a filament lamp arrangement is used in which there is a filament in a bulb made of a transparent material.

The above described heat source has several lamp units in which several heaters are arranged parallel to one another and in which there is at least one filament in the axial direction of the bulb.

Figure 3:
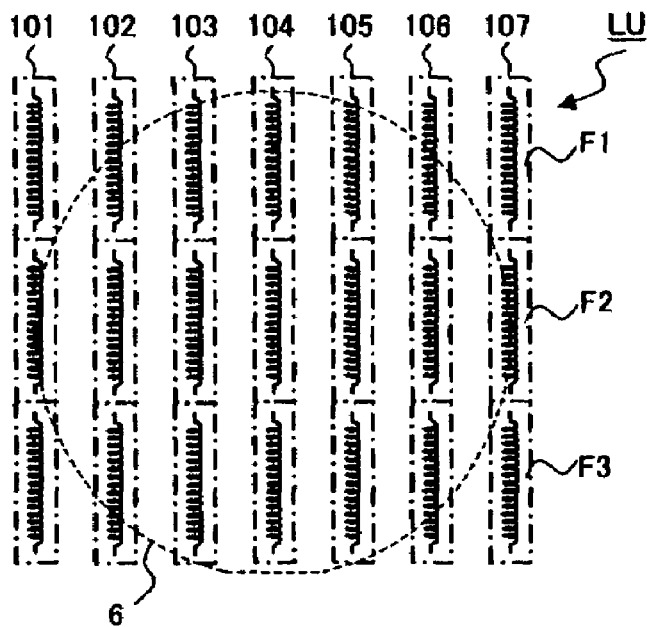
FIG. 3 is a schematic depiction of a lamp unit.

FIG. 3 shows a schematic of a lamp unit LU formed, for example, of several heaters 101, 102, 103, 104, 105, 106, and 107 which have, for example, several filaments F1, F2 and F3, each of which can be supplied with power independently of one another. In FIG. 3, a total of 21 filaments can be operated independently of one another.

The number of heaters and the number of filaments of the respective heater are, of course, not limited to the above described example, but can be set as desired.

Figure 4:
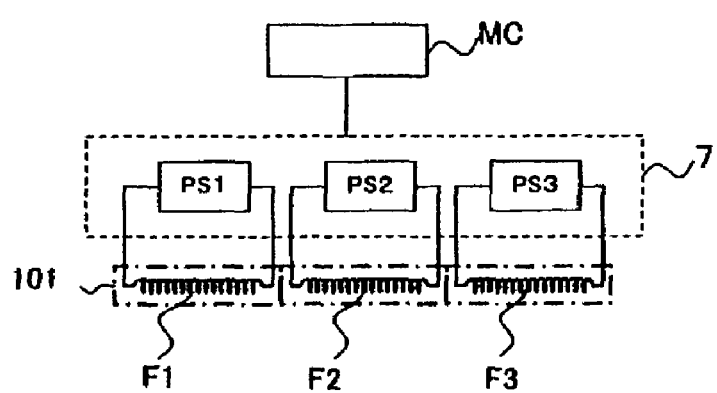
FIG. 4 is a schematic of one example of the connection of the respective filament of the heater to the power supply part.

The filaments F1, F2 and F3 for the respective heater of the lamp unit LU are connected specifically to an individual feed device. FIG. 4 shows a schematic of one example of the connection of the respective filament of the heater 101 to the power source part.

As is shown in FIG. 4, the filament F1 of the heater 101 is connected to a feed device PS1. Likewise, a filament F2 is connected to a feed device PS2 and a filament F3 is connected to a feed device PS3. The feed devices PS1, PS2, PS3, correspond to the power source part 7 shown in FIG. 1. As for the main control element MC, it is possible to control the power supply to the filaments F1, F2 and F3 of the heater 101 individually by controlling the operation of the feed devices PS1, PS2, PS3.

This arrangement of the lamp unit LU enables adjustment of the distribution of the illuminance on the article which is to be processed and which has been moved by a given distance away from the lamp unit LU in a precise manner, and moreover, in any distribution. Adjustment of the distribution of the illuminance on the article to be processed, which adjustment is asymmetrical to the shape of the article to be processed, is therefore enabled. In the case in which the distribution of the degree of local temperature variation on the substrate which constitutes the article to be processed and which is being thermally processed is asymmetrical to the substrate shape, a corresponding adjustment of the distribution of the illuminance on the article to be processed is enabled, by which uniform heating of the article to be processed is enabled.

If adjustment should be performed in the relative center area of the article 6 to be processed, such that the distribution of the intensity of the light, which is emitted from several filaments which the adjacent heaters have and which are arranged relatively closely to one another, becomes essentially the same, power supply to these several filaments can also be carried out using the same feed device.

Figure 5:
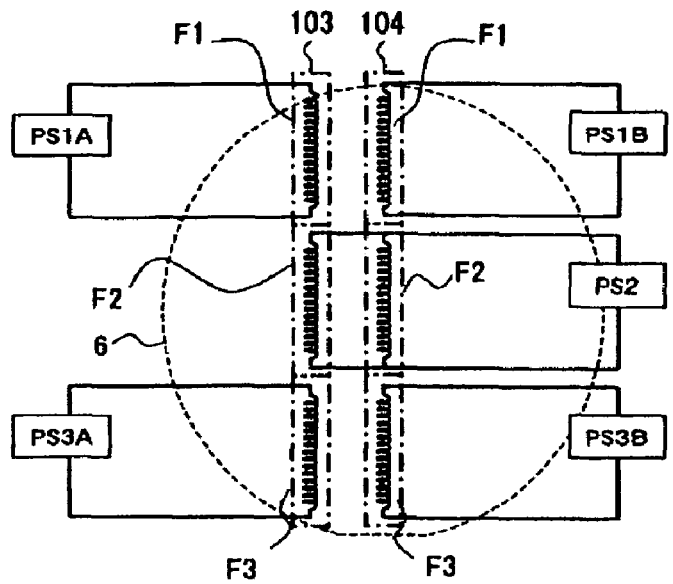
FIG. 5 is a schematic of one example of the power supply to several filaments which are routed via several heaters.

In the case, for example, as shown in FIG. 5 in which adjustment should be performed in the relative center area of the article 6 to be processed, such that the distribution of the intensity of the light, which is emitted from the filaments F2, F2 of the heaters 103, 104 which are adjacent to one another, becomes essentially the same, power supply to the filaments F1, F3 of the heater 103 and the filaments F1, F3 of the heater 104 can be carried out by feed devices PS1A, PS3A, PS1B, PS3B which are independent of one another and the power supply to the filaments F2, F2 of the heaters 103, 104 can be done with the same feed device PS2.

If adjustment should be performed such that, in the relative center area of the article 6 to be processed, the distribution of the intensity of the light which is emitted from the filaments of the heaters, which filaments which are adjacent to one another, becomes essentially the same, the power supply to these filaments which are adjacent to one another can be carried out using the same feed device.

Figure 6:
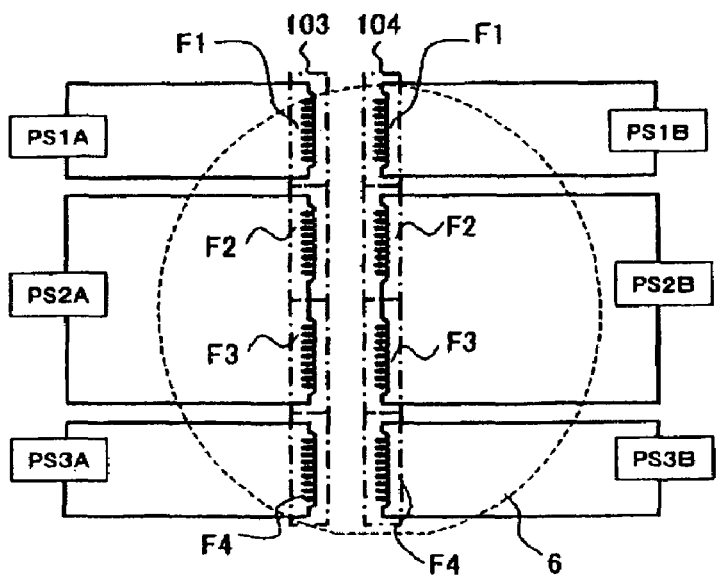
FIG. 6 is a schematic of one example of the power supply to several filaments of a single heater.

In the case for example as shown in FIG. 6 in which adjustment should be performed such that, in the relative center area of the article 6 to be processed, the distribution of the intensity of the light which is emitted from the filaments F2, F3 of the heater 103 which are adjacent to one another becomes essentially the same, and if the distribution of the intensity of the light which is emitted from the filaments F2, F3 of the heater 104 which are adjacent to one another becomes essentially the same, the power supply to the filaments F1, F4 of the heater 103 and the filaments F1, F4 of the heater 104 can be carried out by feed devices PS1A, PS3A, PS1B, PS3B which are independent of one another, and the power supply to the adjacent filaments F2, F3 of the heater 103 can be performed using the same feed device PS2A and the supply to the adjacent filaments F2, F3 of the heater 103 can be performed using the same feed device PS2B.

This means that at least two of n×m filament parts of the lamp unit can be supplied with power by a common feed device where n is the number of heaters of which the above described lamp unit is comprised and m is the number of the divided filament parts of the respective heater.

If there are two groups of lamp units, at least two of n1×m1+n2×m2 filament parts which the first lamp unit and second lamp unit have are supplied with power by a common feed device, where n1 is the number of heaters of which the first lamp unit is comprised, m1 is the number of divided filament parts of the respective heater, n2 is the number of heaters of which the second lamp unit is comprised, and m2 is the number of divided filament parts of the respective heater.

Therefore, depending on the desired distribution of the illuminance, several filaments can also be connected to a single feed device without each individual one of all the filaments of the lamp unit LU being provided with a feed device. In other words, the type and manner of the division of several heaters with respect to the electrical circuit can be optionally set according to the desired distribution of the illuminance.

Figure 7:
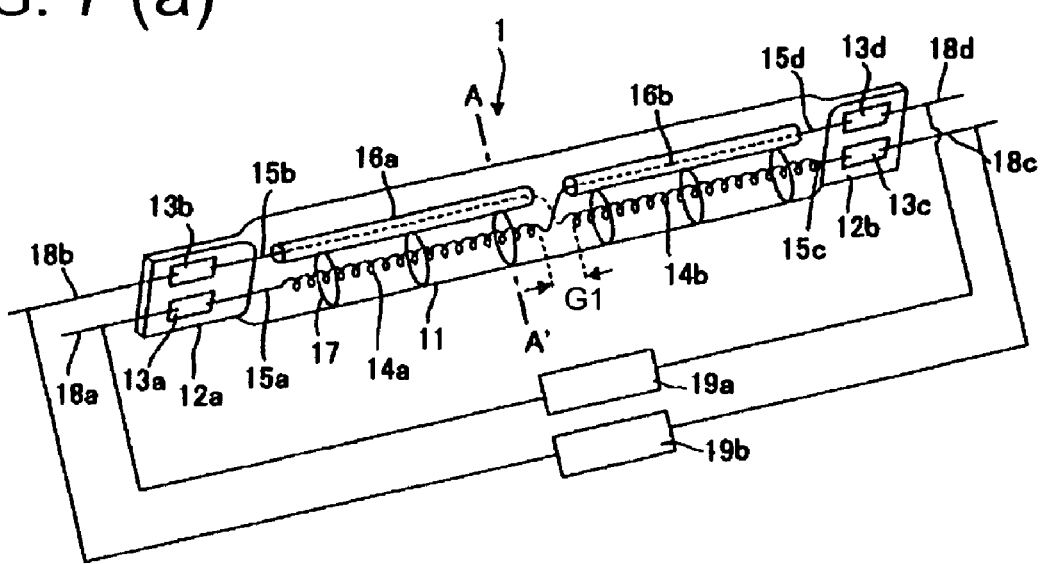
FIGS. 7(a) & 7(b) each show a schematic of a first embodiment of the heater as in accordance with the invention.
Figure 7:
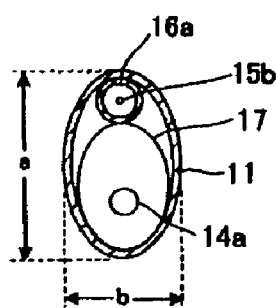

In FIGS. 4 and 6, the lead wires which connect the two ends of the filaments F1, F2, F3, F4 of the heaters 101, 103, 104 to the feed devices PS1, PS1A, PS1B, PS2, PS2A, PS2B, PS3, PS3A, PS3B are shown in such a way that they are routed other than the two ends of the heaters 101, 103, 104. They are schematics for simplification of understanding of the manner in which the filaments are connected to the feed devices. In practice, the above described feed devices are all routed out from the two ends of the heaters 101, 103, 104, as is shown below using FIGS. 7(a), 7(b) & 10.

For example, in FIGS. 7(a) & 7(b), a lead wire which connects a filament part 14a the feed device 19a is routed out from the two ends of the heater 1 through the arrangement in which lead wires 15a, 15d are connected via metal foils 13a, 13d to the outer leads 18a, 18d which extend to the outside from hermetically sealed portions 12a, 12b with which the two ends of the heater 1 are each provided, as is described below. Likewise, a lead wire, which connects a filament part 14b to the feed device 19b, is routed out from the two ends of the heater 1 through the arrangement in which the lead wires 15b, 15c are connected via metal foils 13b, 13c to the outer leads 18b, 18c which extend to the outside from the hermetically sealed portions 12a, 12b.

The first lamp unit 10 and the second lamp unit 20 of the above described heating device 100 assume the concepts with respect to the lamp unit LU. The respective heater 1 is arranged such that there is at least one filament in the axial direction of the bulb.

As is shown in FIGS. 1 & 2, for the first lamp unit 10, which is located above the article 6 to be processed, there are 10 heater 1 (1a, 1b, . . . 1j) arranged parallel to one another; as shown in FIG. 1, they extend in the direction perpendicular to the page of the drawings. For the second lamp unit 20, which is also located above the article 6 to be processed and is located in the upper part of the lamp unit 10 in contact therewith or at a distance thereto, there are ten heaters 1 (1k, 1l, . . . 1t) arranged parallel to one another at a distance up to contact with it; as shown in FIG. 1, they extend in a direction parallel to the page of the drawings.

The heater 1 can also be arranged such that its emission area (total length of the filaments described below) corresponds at least to the length of the area in which the respective filament crosses the article to be processed, in order to reduce as much as possible the irradiation of the area outside of the article to be processed with useless light. Here, the expression "at least corresponds" is defined as not only the case in which the total length of the respective filament is identical to the length of the area in which the respective filament crosses the article to be processed, but also the case in which it slightly exceeds the length of the area in which the respective filament crosses the article to be processed.

If adjustment is carried out here in such a manner that the emission area at least corresponds to the length of the area in which the respective filament crosses the article to be processed, the number of filaments for the respective heater (1a, 1b, . . . 1j), (1k, 1l, . . . 1t) can also be adjusted, such as, for example, in FIG. 2, the number of filaments for the heaters 1a, 1j can be adjusted to 1, the number of filaments for the heater 1b, 1i can be adjusted to 2 and the number of filaments for the heater 1c, 1h can be adjusted to 3.

Alternatively, for each heater 1 (1a, 1b, . . . 1j), (1k, 1l, . . . 1t), the same number of filaments can be taken and there can be differences for the length of each filament in the respective heater (1a, 1b, . . . 1j), (1k, 1l, . . . 1t). For example, the length of the filaments F1, F2, F3 of the heater 1b can be made longer than the length of the length of the filaments F1, F2, F3 of the heater 1a, the length of the filaments F1, F2, F3 of the heater 1c can be made longer than the length of the length of the filaments F1, F2, F3 of the heater 1b, and adjustment can be produced such that the total length of the filaments F1, F2, F3 at least corresponds to the length of the area in which the filaments (F1, F2, F3) cross the article to be processed.

Furthermore both the number of filaments and also their length can be taken into account.

Also, the article 6 to be processed can be located between the first lamp unit 10 and the second lamp unit 20.

As a specific example of the arrangement of the first lamp unit 10 and the second lamp unit 20, for example, the arrangement of the first lamp unit described in Japanese patent application publication JP-A-2002-203804 and corresponding U.S. patent application publication US 2004/0112885 A1 can also be utilized unchanged. However, since, as was described above, in the U-shaped lamps of a horizontal part and a pair of vertical parts which are used as the first lamp unit, as described in Japanese patent application publication JP-A-2002-203804 and corresponding U.S. patent application publication US 2004/0112885 A1, the individual lamps are arranged separately from one another over a space which essentially cannot be ignored, the illuminance in the area directly underneath this space changes (decreases) relatively quickly.

Even if the lamps are operated individually or the feed power to the respective lamp is adjusted individually, and thus, an attempt made to optionally adjust the distribution of the illuminance on the article to be processed, due to the influence of the above described space, the adjustment of the distribution of the illuminance on the article to be processed will be greatly restricted and the possibility of becoming a problem in practical use is great. Furthermore, by using a U-shaped lamp, a space is required which corresponds to the vertical parts of the lamp; this is not advantageous with respect to saving space.

The inventors have therefore invented the heater described below with a new arrangement in order to avoid the above described disadvantage which arises by the arrangement of the first lamp unit which is described in Japanese patent application publication JP-A-2002-203804 and U.S. patent application publication US 2004/0112885 A1.

A first embodiment of the heater of the invention is described below with reference to FIGS. 7(a) & 7(b). As is shown in FIGS. 7(a) & 7(b), the heater 1 is made of a transparent material, such as, for example, silica glass or the like. It has a bulb 11 with a cross section which has an elliptical shape in a plane which orthogonally intersects its axial direction. "Elliptical shape" means all shapes (for example, an oval shape and the like) in which the length a of the major diameter in the longitudinal direction of the above described cross section is larger than the length b of the minor diameter in the direction perpendicular to the longitudinal direction of the above described cross section. The above described cross section can also be circular in the bulb 11.

For the bulb 11, on one of the ends, metal foils 13a, 13b, are installed and a hermetically sealed portion 12a is formed by a pinch seal. On the other end of the bulb 11 metal foils 13c, 13d are installed and a hermetically sealed portion 12b is formed in the same manner as on the other side. Thus, the inside of the bulb is sealed hermetically. In the bulb 11, filament parts 14a, 14b, for example, made of tungsten, which are divided into two parts in the axial direction of the bulb 11, are arranged coaxially along the axis of the bulb 11 separated by a gap G1.

The gap G1 is a space in which neither filament part 14a nor filament part 14b is present. It is a nonemitting area. In the case in which the total length of the space G1 is too large, the distribution of the intensity of the light which irradiates the article to be processed therefore has variations. Therefore, it is desirable for the total length of the space G1 to be as small as possible. However, in the case in which the total length of the space G1 is too small, an unwanted discharge forms more often between the filament part 14a, 14b which lie in succession in the longitudinal direction. As a result, it is necessary for the total length of the space G1 to be large to some extent. With consideration of this knowledge, it was found experimentally that it is advantageous to fix the total length of the space G1 in a range from 2 mm to 8 mm in order to make the variation of the distribution of the intensity of the light which irradiates the article to be processed as small as possible, and moreover, to prevent formation of an unwanted discharge between the filament part 14a, 14b which are arranged in succession in the longitudinal direction. It is especially advantageous to fix the total length of the space G1 in the range of 2 mm to 5 mm, for example, 5 mm.

The heater of the invention is characterized in that the two filament parts 14a, 14b are supplied with power independently of one another. Specifically:

- a lead wire 15a, which is connected to the metal foil 13a, is electrically connected to one end of the filament part 14a;
- the lead wire 15d which is connected to the metal foil 13d is electrically connected to the other end of the filament part 14a, and
- the outside of the lead wire 15d is covered with an insulating tube 16b, for example, of silica glass, in the area opposite the outside of the filament part 14b, and is connected to the other end of the filament part 14a.

In this way, formation of an unwanted discharge between the filament part 14b and the lead wire 15d which are opposite one another can be reliably prevented.

For the filament part 14b, as for the filament part 14a, a lead wire 15c which is electrically connected to a metal foil 13c is electrically connected to one end, and a lead wire 15b which is electrically connected to a metal foil 13b is electrically connected to the other end. The area of the lead wire 15b, which area is opposite the filament part 14a, is covered with an insulating tube 16a, for example, of silica glass, and the the lead wire 15b is connected to the other end of the filament part 14b.

These filament parts 14a, 14b are supported within anchors 17 which are arranged repeatedly in the axial direction of the bulb 11 and are clamped between the inner wall of the bulb 11 and the insulating tube 16a or 16b.

Outer leads 18a, 18b, which are diverted to the outside from the hermetically sealed portion 12a, are electrically connected to the metal foils 13a, 13b on the side of the hermetically sealed portion 12a. Each of the outer leads 18c, 18d is also connected to a respective one of the metal foils 13c, 13d on the side of the hermetically sealed portion 12b. In this way, the filament part 14a is electrically connected to the outer leads 18a, 18d and the filament part 14b is connected to the outer leads 18b, 18c.

The heater 1 with the above described arrangement is operated by a first feed device 19a being connected between the outer leads 18a, 18d, by a second feed device 19b being connected between the outer leads 18b, 18c, and the filament parts 14a, 14b, each being supplied with power independently of one another by a feed device, the feed device which supplies the filament part 14a differing from the feed device for the filament part 14b. The feed devices 19a, 19b are variable power sources. In the case, for example, in which the temperature of the article to be processed directly underneath the filament part 14a is lower than the temperature of the article to be processed directly underneath the filament part 14b, by increasing the power supplied to the filament part 14a, adjustment can be performed in such a way that the amount of light emitted from the filament part 14a is increased, as is described below.

The first feed device 19a and the second feed device 19b correspond to the power source part 7 for the heating device shown in FIG. 1. Here, if the heaters (1a, . . . 1j, 1k, . . . 1t) each have the arrangement shown in FIGS. 7(a) & 7(b), and when each feed device is connected to the respective filament, 40 feed devices correspond to the above described power source part 7. The respective feed device can supply a direct current power or an alternating current power to the filament.

The heater according to the first embodiment of the invention, by the measure shown in FIGS. 7(a) & 7(b), in which a pair of outer leads 18a, 18d, are electrically connected to the filament part 14a and are diverted to the outside from the hermetically sealed portions 12a, 12b at the two ends of the bulb, and in which a pair of outer leads 18b, 18c, are electrically connected to the filament part 14b and diverted to the outside from the hermetically sealed portions 12a, 12b, the effect is achieved that, in the case of application of a high voltage to the heater, the disadvantages of poor insulation resistance, leakage and the like hardly occur, since the pertinent pairs of outer leads are not present in the same hermetically sealed portion.

Here, a case can be imagined in which the first feed device 19a and the second feed device 19b supply direct current power to the filament parts 14a, 14b. When the high voltage side of the first feed device 19a is connected to the outer lead 18a and the low voltage side of the second feed device 19b is connected to the outer lead 18b, the potential difference between the outer lead 18a and the outer lead 18b is large, by which, under certain circumstances, the possibility cannot be precluded that the disadvantages of poor insulation resistance, leakage and the like will occur in the hermetically sealed portion 12a. Therefore, it is desirable to adjust the power supply to the respective outer lead with the respective filament which is present in the same hermetically sealed portion such that the potential difference between the outer leads does not become too large.

In the case of the heater shown in FIGS. 7(a) & 7(b), for example, the high voltage side of the first feed device 19a is connected to the outer lead 18a and the high voltage side of the second feed device 19b is connected to the outer lead 18b.

On the other hand, a case can be imagined in which the first feed device 19a and the second feed device 19b supply alternating current power to the filaments parts 14a, 14b. Here, if the phase of the voltage waveform of the voltage which has been applied by the first feed device 19a to the pair of outer leads 18a, 18d, differs from the phase of the voltage waveform of a voltage which has been applied by the second feed device 19b to the pair of outer leads 18b, 18c, at a certain instant, the potential difference between the outer lead 18a and the outer lead 18b in the hermetically sealed portion 12a and the potential difference between the outer lead 18c and the outer lead 18d in the hermetically sealed portion 12b become large. Therefore, under certain circumstances, the possibility cannot be precluded that the disadvantage of poor insulation resistance, leakage and the like will occur in the hermetically sealed portions 12a, 12b. Therefore, it is desirable for both the outer lead 18a and also the outer lead 18b and both the outer lead 18c and also the outer lead 18d to be grounded.

Furthermore, for the lead wires 15b, 15d, since the areas thereof which are opposite the filaments parts 14a, 14b are covered with the insulating tubes 16a, 16b, formation of an unwanted discharge between the adjacent filaments parts 14a, 14b can be reliably prevented.

Also, because the bulb has an elliptical cross section in the plane which orthogonally intersects its axial direction, the arrangement according to FIGS. 7(a) & 7(b) can be easily implemented in which the filaments parts 14a, 14b and the insulating tubes 16a, 16b with which the lead wires 15b and 15d are covered, are arranged parallel to one another along the axial direction of the bulb in the longitudinal direction (direction a in FIG. 7(b)).

For a heating device with the heaters according to the first embodiment of the invention, the arrangement in which the filament 14 is arranged in a bulb 11 of transparent material, and the filament parts 14a, 14b, are supplied with power independently of one another, yields the following effects:

If, for the article 6 to be processed which is shown in FIG. 2, the temperature of the peripheral area (hereinafter also called "area 1") directly underneath the point at which, for example, the heater 1b crosses the heaters 1m to 1o is lower than the temperature of the other area (hereinafter also called "area 2") in the article 6 to be processed, or if it is clear beforehand that the degree of temperature increase in the area 1 is less than the degree of temperature increase in the area 2, by increased power supply to the filaments which correspond to the area 1 of the heater 1 and by increasing the amount of light emitted from the filaments, the formation of a temperature deviation between the area 1 and the area 2 can be reliably prevented and a uniform temperature distribution can be achieved over the entire article 6 to be processed.

Moreover, by the measure that there are several heaters 1 within a single bulb 11 with an arrangement the filament is divided into several filament parts arranged coaxially along the axis of the bulb, and that, thus, a heating device is formed, the total length of the space G1 between the individual filament parts 14a, 14b, can be fixed to a range in which the variations of the intensity distribution of the light which has been emitted onto the article to be processed can be reduced to an extreme degree and in which, moreover, there is no unwanted discharge between the filament parts 14a, 14b, which are arranged in succession in the longitudinal direction, i.e., to a region of from 2 mm to 8 mm, especially preferably to an extremely small region of from 2 mm to 5 mm, by which the temperature distribution of the article 6 to be treated can be made more uniform than in a conventional device. Moreover, the heating device can be made smaller by reducing the size of the space which is required for the arrangement of the heaters (mainly in the vertical direction).

Furthermore, a case can be imagined in which the surface of the semiconductor wafer is divided into several concentric, annular, virtual areas with an essentially identical width in the radial direction, when the article 6 to be processed is a circular semiconductor wafer. The innermost area is a circular region. In this case, in an annular, virtual area which is located on the outermost side including the edge area of the semiconductor wafer, the diameter of the circle outside the area is maximum compared to the other annular, virtual areas. This means that the area of the annular virtual area which is located on the outermost side is maximum compared to the other annular virtual areas.

On the other hand, heat radiation from the edge face takes place in the vicinity of the edge area. The vicinity of the edge area is also still an area which is in contact with the mounting frame 5 which supports the semiconductor wafer. Therefore, in the vicinity of the edge area, the heat dissipates more often than in the other annular virtual areas in the vicinity of the center. As a result, a temperature deviation occurs more often in the vicinity of the edge area. Therefore, semiconductor chips become defective more easily in the annular virtual area on the outermost side than in the other virtual areas. In particular, since the annular, virtual area on the outermost side compared to the other areas has the largest area, as was described above, the relatively large number of semiconductor chips which become defective cannot be ignored.

The number of semiconductor chips which are free of faults is increased by controlling a heat source which has the heaters in accordance with the invention, by changing, and thus, adjusting the intensity distribution of the emitted light such that the temperature deviation in the annular, virtual area on the outermost side is reduced and by making the temperature distribution more uniform in the semiconductor wafer edge area which constitutes the region in which a temperature deviation often occurs.

In the article to be processed, if the area which the respective filament of the respective heater 1 crosses is identical to the total length of the respective filament, the end of the area which the above described respective filament crosses corresponds to the boundary area between the filament and the lead wire. Since the lead wire does not emit, when this area is irradiated with light, an emitting region and a nonemitting region of the heater must be taken into account. On the other hand, when the area outside this region is irradiated with light, only one emitting region of the heater need be considered. As a result, the amount of light which has been emitted onto this edge area is smaller than the amount of light which is emitted onto the area outside this region. By reducing the temperature of the edge area of the article to be processed, compared to other points on the above described region, it is possible for a temperature distribution to form.

On the other hand, excess energy is supplied to the heater when the total length of the respective filament greatly exceeds this region. Here, the efficiency of utilization of the light energy is reduced.

In this connection, adjusting the total length of the filament of the respective heater 1, at least according to the length of the area in which the article to be processed is crossed by the respective filament, especially adjustment in such a manner that the total length of the respective filament slightly exceeds the length of the area in which the article to be processed is crossed by the respective filament, enables the end of the filament with a low intensity of the radiated light to be moved away from the edge area of the article to be processed. Furthermore, it is possible to greatly diminish the fact that the area outside of the article to be processed is uselessly irradiated with light. Therefore, there is no worry that the above described disadvantage will occur.

Figure 8:
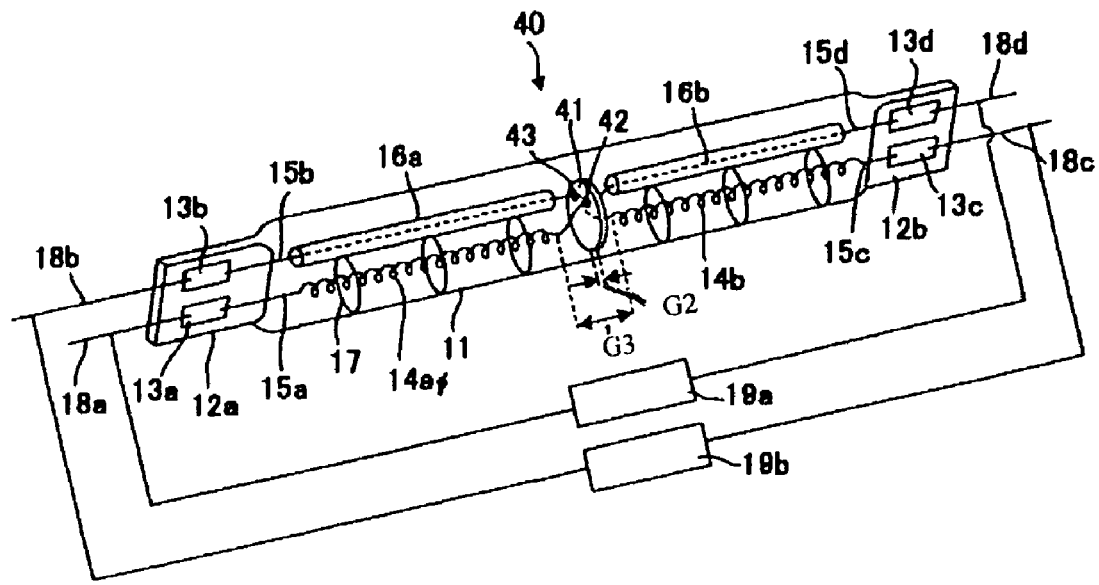
FIG. 8 is a perspective view of a second embodiment of the heater of the invention.

A second embodiment of the heater of the invention is described below with reference to FIG. 8. In FIG. 8, the parts corresponding to the same parts as in FIGS. 7(*a*) & 7(*b*) are provided with the same reference numbers as in FIGS. 7(*a*) and (*b*).

As is shown in FIG. 8, for a heater 40 according to the second embodiment, there are two filament parts 14*a*, 14*b* which are arranged coaxially along the axis of bulb 11. Between the filament part 14*a* and the filament part 14*b*, an insulator 41, for example, made of silica glass, is arranged such that there is a space between the filament part 14*a* and the filament part 14*b*. Furthermore, the insulator 41 can border the filament parts 14*a*, 14*b*. The lead wire 15*d* passes through a through opening 42 which is provided in the insulator 41. For the lead wire 15*d*, the outside of the area which is opposite the filament part 14*b* is covered with an insulating tube 16*b*. One end of the lead wire 15*d* is electrically connected to a metal foil 13*d*, while the other end is electrically connected to the filament part 14*a*. The lead wire 15*b* passes through a through opening 43 which is located in the insulator 41. For the lead wire 15*b*, the outside of the area which is opposite the filament part 14*a* is covered with an insulating tube 16*a*. One end of the lead wire 15*b* is electrically connected to a metal foil 13*b* while the other end is electrically connected to the filament part 14*b*.

The thickness G2 in the axial direction of the insulator 41 is in a range of from 1 mm to 3 mm, so that no unwanted discharge occurs between the filament part 14*a* and the filament part 14*b*. It is, for example, 2 mm. If there is a space between the insulator 41 and the filament part 14*a* and/or filament part 14*b*, it is advantageous for the distance G3 between the filament part 14*a* and the filament part 14*b* to be in the range from 3 mm to 8 mm, so that the variation of the intensity distribution of the light which has been emitted onto the article to be processed can be reduced to an extreme degree, and, moreover, between the filament part 14*a* and the filament part 14*b* which lie in succession in the longitudinal direction no unwanted discharge occurs. It is especially advantageous if it is in the range of from 3 mm to 5 mm, for example, 5 mm.

The same effect as in a heater according to the first embodiment is also obtained by such a heater 40 according to the second embodiment. This means that, in a heating device with heaters 40, effects that can be obtained are that a uniform temperature distribution can be implemented over the entire article 6 to be processed and the device can be made smaller.

Because an insulator 41 is located between the filament part 14*a* and the filament part 14*b*, it is possible to reliably prevent an unwanted discharge from forming between the filament part 14*a* and the filament part 14*b*. Furthermore, by the measure that the lead wires 15*d*, 15*b* which are connected to the filaments parts 14*a*, 14*b* pass through the through opening 42 and the through opening 43 which are located in the insulators 41, the lead wires 15*d*, 15*b* are separated by the insulator 41, by which it is possible to reliably prevent the two lead wires from coming into contact with one another and a short circuit from occurring.

Figure 9:
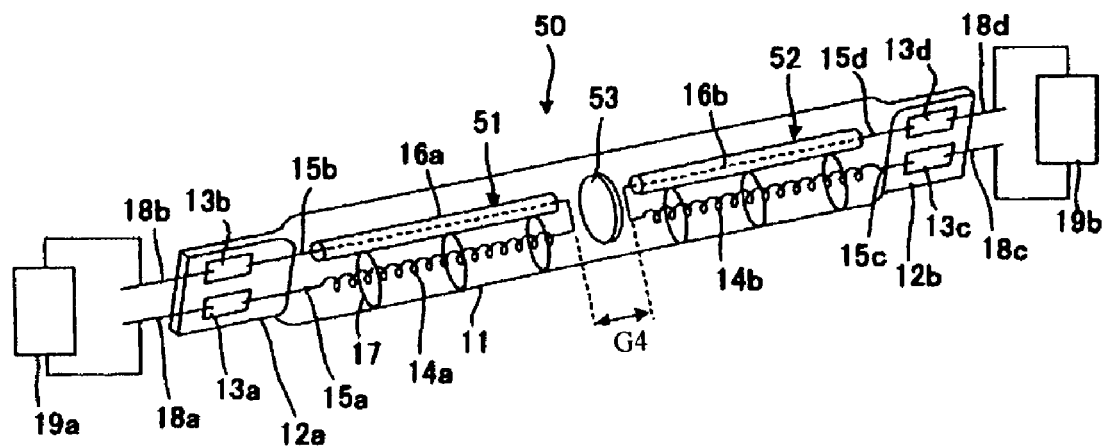
FIG. 9 is a perspective of a third embodiment of the heater of the invention.

A third embodiment of the heater in accordance with the invention is described below with reference to FIG. 9. In FIG. 9, the parts corresponding to the same parts as in FIGS. 7(*a*) & 7(*b*) are provided with the same reference numbers as in FIGS. 7(*a*) & 7(*b*).

As is shown in FIG. 9, for a heater 50, there are two filament assemblies 51, 52 located opposite each other in the bulb 11, separated by an insulator 53. The two filament parts 14*a*, 14*b* are arranged coaxially along the axis of the bulb 11. The insulator 53 is arranged such that there is a space between the filament part 14*a* and the filament part 14*b*. It is advantageous for the distance G4 between the filament part 14*a* and the filament part 14*b* to be in the range from 3 mm to 8 mm, so that the variation of the intensity distribution of the light which has been emitted onto the article to be processed can be reduced to an extreme degree and no unwanted discharge occurs between the filament parts 14*a* & 14*b*, which lie in succession in the longitudinal direction. It is especially advantageous if the distance G4 is in the range from 3 mm to 5 mm, for example, 5 mm.

The filament assembly 51 is comprised of the filament part 14*a*, the lead wires 15*a*, 15*b*, and the insulating tube 16*a*. The end of the lead wire 15*b* for this assembly is bent in a U-shape on the side connected to the filament part 14*a*. Furthermore, a linear area which is connected to this U-shaped area and which is opposite the filament part 14*a* is covered with the insulating tube 16*a*.

The filament assembly 52 is comprised of the filament part 14*b*, the lead wires 15*c*, 15*d* and the insulating tube 16*b*. The end of the lead wire 15*d* for this assembly is bent in a U-shape on the side connected to the filament part 14*b*. Furthermore, a linear area which is connected to this U-shaped area and which is opposite the filament part 14*b* is covered with the insulating tube 16*b*.

The outer leads 18*a*, 18*b* are electrically connected to the filament part 14*a* are each diverted to the outside from the hermetically sealed portion 12*a*. The outer leads 18*c*, 18*d* are electrically connected to the filament part 14*b* and are each diverted to the outside from the hermetically sealed portion 12*b*.

As is shown in FIG. 9, for the heater 50 a feed device 19*a* is electrically connected between the outer lead 18*a* and the outer lead 18*b*, and furthermore a feed device 19*b* is electrically connected between the outer lead 18*c* and the outer lead 18*d*. The filaments parts 14*a* and 14*b* are supplied with power independently of one another, the feed device which supplies the filament part 14*a* differing from the feed device for the filament part 14*b*.

The same effect as in a heater according to the first embodiment is also obtained by such a heater 50 according to the third embodiment. This means that in a heating device with heaters 50, the effects that can be obtained are that a uniform temperature distribution can be implemented over the entire article 6 to be processed and the device can be made smaller.

Furthermore, in the heater 50, the filament part 14*a* is supplied with power by the outer leads 18*a*, 18*b*, on the side of the hermetically sealed portion 12*a* and the filament part 14*b* supplied with power by the outer leads 18*c*, 18*d*, on the side of the hermetically sealed portion 12*b*. Even without the arrangement of a through opening for passage of the lead wires in the insulator 53 which is located between the filament part 14*a* and the filament part 14*b*, as for the two lead wires, therefore, there is no possibility of shorting. Therefore the costs for producing the heater can be reduced.

For the heater 50, a pair of outer leads 18a, 18b are electrically connected to the filament part 14a and are diverted to the outside from the hermetically sealed portion 12a. The outer leads 18c, 18d, are electrically connected to the filament part 14b and are each diverted to the outside from the same hermetically sealed portion 12b. Therefore, in the case of application of a high voltage to the heater, an insulation arrangement, a measure against leakage and the like must be taken into account.

Figure 10:
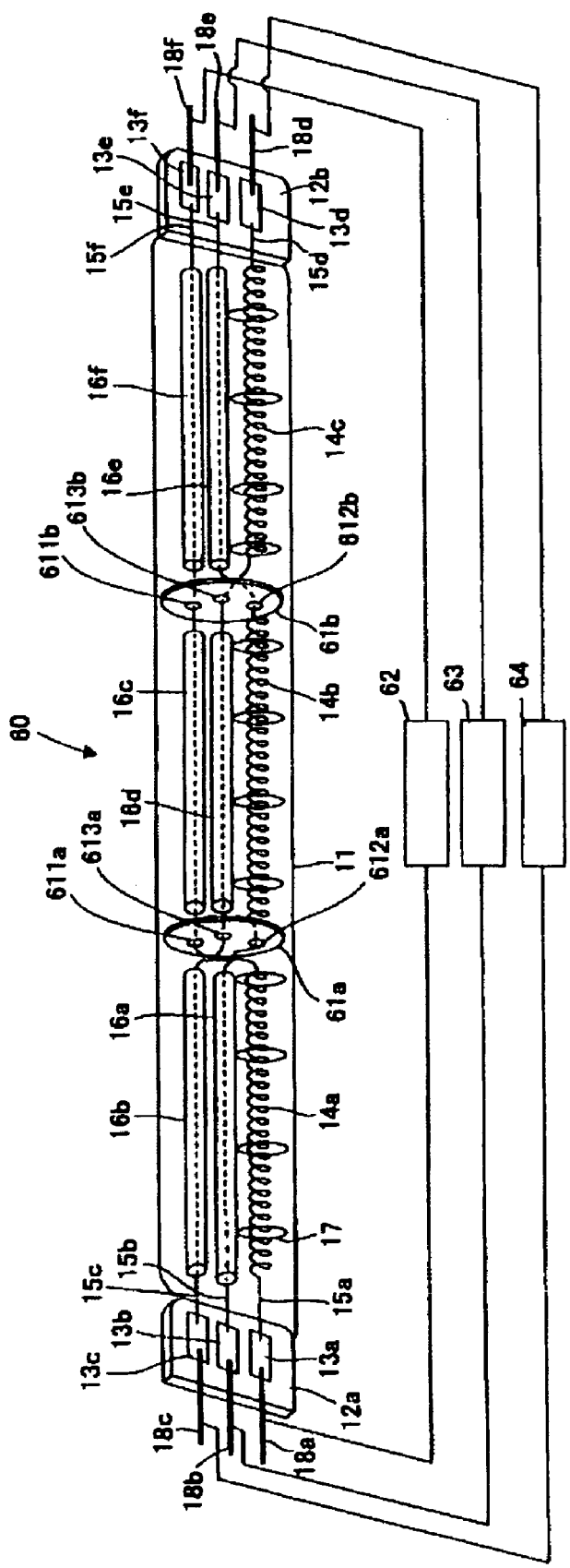
FIG. 10 is a perspective of a fourth embodiment of the heater in accordance with the invention.
Figure 13:
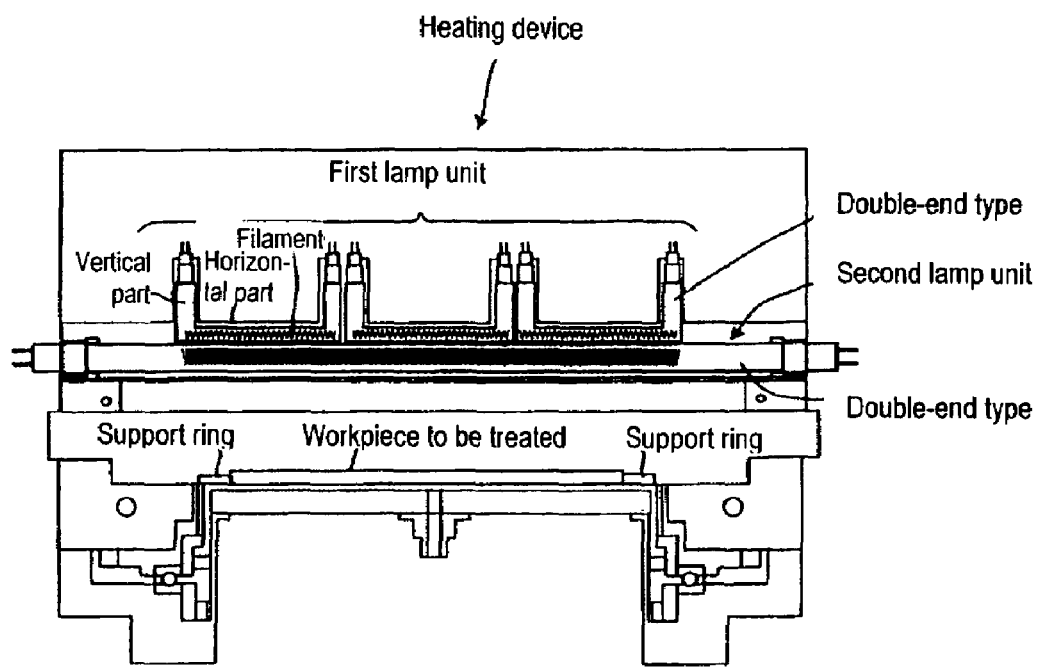
FIG. 13 is a front view of a conventional heating device.

A fourth embodiment of the heater of the invention is described below using FIG. 10. In FIG. 10, the parts corresponding to the same parts as in FIGS. 7(a) & 7(b) are provided with the same reference numbers.

As is shown in FIG. 10, in the bulb 11 of a heater 60, a hermetically sealed portion 12a is formed by metal foils 13a, 13b, 13c having been installed in one end and pinch sealed, and a hermetically sealed portion 12b is formed by metal foils 13d, 13e, 13f, having been installed in the other end and pinch sealed. Thus, the inside of the bulb is hermetically sealed. In such a bulb 11, the filaments parts 14a, 14b, 14c which have been divided into three parts in the axial direction are arranged coaxially along the axis of the bulb 11. There is an insulator 61a between the filament part 14a and the filament part 14b. There is an insulator 61b between the filament part 14b and the filament part 14c. Furthermore, a respective outer lead 18a, 18b, 18c, 18e, 18f is electrically connected to each of the metal foils 13a, 13b, 13c, 13d, 13e, 13f.

A lead wire 15a is connected to the metal foil 13a and is electrically connected to one end of the filament part 14a, while a lead wire 15f is connected to the metal foil 13f and is electrically connected to the other end of the filament part 14a. Specifically, the lead wire 15f passes through a through opening 611a which is located in the insulator 61a, an insulating tube 16c which is opposite the filament part 14b, a through opening 611b which is located in the insulator 61b, and an insulating tube 16f which is opposite the filament 14c, and is connected to the metal foil 13f.

A lead wire 15b is connected to the metal foil 13b and is electrically connected to an end of the filament part 14b and passes through a through opening 612a which is located in the insulator 61a and an insulating tube 16a which is opposite the filament part 14a. A lead wire 15e is connected to the metal foil 13e and is electrically connected to the other end of the filament part 14b and passes through an opening 612b which is located in the insulator 61b and an insulating tube 16e which is opposite the filament 14c.

A lead wire 15c is connected to the metal foil 13c and is electrically connected to the end of the filament 14c, while a lead wire 15d is connected to the metal foil 13d and is electrically connected to the other end of the filament 14c. Specifically, the lead wire 15c passes through a through opening 613b which is located in the insulator 61b, an insulating tube 16d which is opposite the filament part 14b, a through opening 613a which is located in the insulator 61b, and an insulating tube 16b which is opposite the filament part 14a.

In the heater 60, there is a first feed device 62 between the outer lead 18a and the outer lead 18f, there is a second feed device 63 between the outer lead 18b and the outer lead 18e, and there is a third feed device 64 between the outer lead 18c and the outer lead 18d. The heaters are subjected to operation by supplying power to the filaments parts 14a, 14b, 14c independently of one another by the different feed devices. The feed devices 62, 63, 64 are variable power sources. If necessary, the amount of feed can be adjusted.

In this connection, the above described feed devices 62, 63, 64 correspond to the power source part 7 in the heating device which is shown in FIG. 1. Here, if the heaters 1 (1a, . . . , 1j, 1k, . . . , 1t) each have the arrangement shown in FIG. 10 and if the feed device is connected to the respective filament, 60 feed devices correspond to the above described power source part 7.

The respective feed device can supply direct current power or alternating current power to the filaments.

In this heater according to the fourth embodiment, the filaments parts 14a, 14b, 14c are arranged coaxially along the axis of the bulb 11, and moreover, the feed amount for the respective filament can be adjusted by an individual feed device. Therefore, the amount of light which is radiated from the respective filament can be freely regulated. In this way, the temperature can be adjusted in a narrower range than in the heaters according to the embodiments 1 to 3. Therefore, the uniformity of the temperature distribution of the article 6 to be processed can be improved even more. Furthermore, there is the result that, as for the heaters according to the embodiments 1 to 3, the heating device can be made smaller.

The numerical values of the heating device with the heaters of the invention are shown by way of example below. However, the invention is not limited to the example of the numerical values which is described below.

The bulb (11) is made of silica glass. In a cross section including the plane which orthogonally intersects the axis of the bulb, a is 11 mm according to FIGS. 7(a) and b is 8 mm according to FIG. 7(a). Furthermore, the thickness of the bulb (11) is 1 mm. It is formed in the shape of a rod-shaped tube and has a total length of 447 mm (length with the two hermetically sealed portions (12)).

The filament (14) is thus formed in the manner of a coil with an outside diameter of 3.86 mm from a tungsten wire with a wire diameter of 0.53 mm that is wound with a pitch of 0.66 mm. The total length of each of the filaments parts 14a & 14b is 200 mm. The insulating tube (16) is made of silica glass. Its outside diameter is 2 mm, the inside diameter is 1 mm and the total length is 205 mm. It is formed of a rod-shaped tube.

In the heaters according to embodiments 1 to 4, the filament parts are arranged coaxially. However, the invention is not limited thereto. Specifically, in accordance with the invention, an arrangement can be undertaken in which the filament parts are not coaxially arranged.

What is claimed is:

1. Heater, comprising:
   a single bulb of transparent material; and
   a filament within the bulb, the filament being comprised of a plurality of filament parts arranged coaxially in the axial direction of the bulb and each of the filament parts being connected in a manner to be supplied with power independently of the supply of power to the other filament parts,
   wherein lead wires are electrically connected to each end of each filament part, the lead wires for each of the filament parts being routed to opposite ends of the bulb, and
   wherein the lead wire is covered with an insulating tube in an area in which the lead wire is opposite the filament.

2. Heater as claimed in claim 1, further comprising an insulator between the filament parts.

3. Heater as claimed in claim 1, wherein the bulb has a cross section with an elliptical shape.

* * * * *